(12) United States Patent
Kobayashi (10) Patent No.: US 6,426,529 B2
(45) Date of Patent: Jul. 30, 2002

(54) SEMICONDUCTOR MEMORY (75) Inventor: Kiyoteru Kobayashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/756,782

(22) Filed: Jan. 10, 2001

(30) Foreign Application Priority Data

Jul. 5, 2000 (JP) ..................................... P2000-203897

(51) Int. Cl.⁷ ............................................ H01L 29/788
(52) U.S. Cl. ...................... 257/316; 257/321; 438/264; 438/593
(58) Field of Search ................................ 257/316, 321; 438/264, 257–263, 265–267, 593–4

(56) References Cited

U.S. PATENT DOCUMENTS 4,823,175 A * 4/1989 Fontana

OTHER PUBLICATIONS

"A 1.28μm² Contactless Memory Cell Technology for a 3V–Only 64Mbit EEPROM," by Kume et al., IEDM 92, pp. 991–993.

"A 0.4μm² Self–Aligned Contactless Memory Cell Technology Suitable for 256–Mbit Flash Memories," by Kato et al., IEDM 94, pp. 921–923.

* cited by examiner

*Primary Examiner*—Richard Booth
(74) *Attorney, Agent, or Firm*—McDermott, Will & Emery (57) ABSTRACT

To provide a semiconductor memory device comprising flash memory cells having higher writing speed, the semiconductor memory of the present invention comprises memory cells each having a channel region, an n-type drain region and an n-type source region that are disposed on both sides of the channel region, a floating gate formed over the channel region via a first oxide film and a control gate formed over the floating gate via a second oxide film, which are formed on a p-type Si substrate, wherein the floating gate includes of a first region located over the channel region via the first oxide film and a second region that is formed to be wider than the first region and is capacitively coupled with the control gate via the second oxide film, the floating gate having T-shaped longitudinal section, wherein a height of the first region is set so that the floating gate has the maximum potential when a control voltage is applied to the control gate.

8 Claims, 10 Drawing Sheets

Fig. 10

SEMICONDUCTOR MEMORY

BACKGROUND OF THE INVENTION

1. Field of the Invention

The present invention relates to a semiconductor memory.

2. Description of the Related Art

The flash memory has a simple construction of memory cell that is suited to packaging with a high density with lower cost per bit, and allows it to write, read and erase data electrically. Thus demand for the flash memory has been increasing and is expected to increase further.

While semiconductor memory devices comprising flash memory cells are required to have higher writing speed as the demand therefor increases, the requirement is not fully satisfied at present.

SUMMARY OF THE INVENTION

Thus an object of the present invention is to provide a semiconductor memory device comprising flash memory cells having higher writing speed.

In order to achieve the object described above, a first semiconductor memory according to the present invention comprises memory cells each having a channel region, an n-type drain region and an n-type source region that are disposed on both sides of the channel region, a floating gate formed over the channel region via a first oxide film and a control gate formed over the floating gate via a second oxide film, which are formed on a p-type Si substrate, wherein the floating gate includes a first region located over the channel region via the first oxide film and a second region that is formed to be wider than the first region and is capacitively coupled with the control gate via the second oxide film, the floating gate having T-shaped longitudinal section, wherein a height of the first region is set so that the floating gate has the maximum potential when a control voltage is applied to the control gate. As a result, the amount of electrons transported to the floating gate can be increased and the writing speed on each memory cell can be increased.

Thus according to the first semiconductor memory of the present invention, a semiconductor memory comprising flash memory cells having higher writing speed can be provided.

A second semiconductor memory according to the present invention comprises memory cells each having a channel region, an n-type drain region and an n-type source region that are disposed on both sides of the channel region, a floating gate formed over the channel region via a first oxide film and a control gate formed over the floating gate via a second oxide film, which are formed on a p-type Si substrate, wherein the floating gate includes a first region located over the channel region via the first oxide film and a second region that is formed to be wider than the first region and is capacitively coupled with the control gate via the second oxide film, the floating gate having T-shaped longitudinal section, wherein a height of the first region is set so as to obtain maximum coupling ratio, which is the ratio of the electrostatic capacitance between the control gate and the floating gate to the electrostatic capacitance of the entire memory cell formed between the control gate and the Si substrate in each memory cell.

Potential of the floating gate can also be maximized with such a constitution as described above.

The electrostatic capacitance of the entire memory cell formed between the control gate and the p-type Si substrate refers to the electrostatic capacitance formed between the control gate and the Si substrate in a single memory cell, and includes the electrostatic capacitance between the control gate and the floating gate, the electrostatic capacitance between the first region and the channel region, the electrostatic capacitance between the second region and the source region, the electrostatic capacitance between the second region and the drain region, the electrostatic capacitance between a side face of the first region and the source region, and the electrostatic capacitance between a side face of the first region and the drain region.

With this configuration, a potential of the floating gate can be made higher and the amount of electrons transported to the floating gate can be increased.

Therefore, according to the second semiconductor memory of the present invention, since the writing speed at each memory cell can be made higher, a semiconductor memory comprising flash memory cells having higher writing speed can be provided.

DETAILED DESCRIPTION OF THE PREFERRED EMBODIMENTS

Preferred embodiment of the present invention will be described below with reference to the accompanying drawings.

The semiconductor memory according to this embodiment of the present invention is a flash memory having a memory elements that allow it to electrically writing and deleting data provided in each memory cell of the p-type substrate 1, and is constituted as described below.

In the semiconductor memory of the embodiment, an n-type source region 31 and an n-type drain region 32 are formed to sandwich the channel region 13 and a floating gate 7 is formed over the channel region 13 via the first oxide film (tunnel oxide film) 4 in every memory cell of the p-type substrate 1, thereby forming a memory cell transistor that is a memory element in each memory cell. The floating gate 7 of the memory cell transistor of each memory cell is provided with a control gate 19 that controls reading and writing of the memory cell transistor being formed thereon via a second insulation film (inter-polysilicon insulating film) 8.

The control gate 19 consists of a phosphorus-doped silicon layer 9 and a tungsten silicide layer 10, and a wiring 12 is formed from an Al—Cu alloy on the control gate 19 via an inter-layer insulating film 11.

Figure 2:
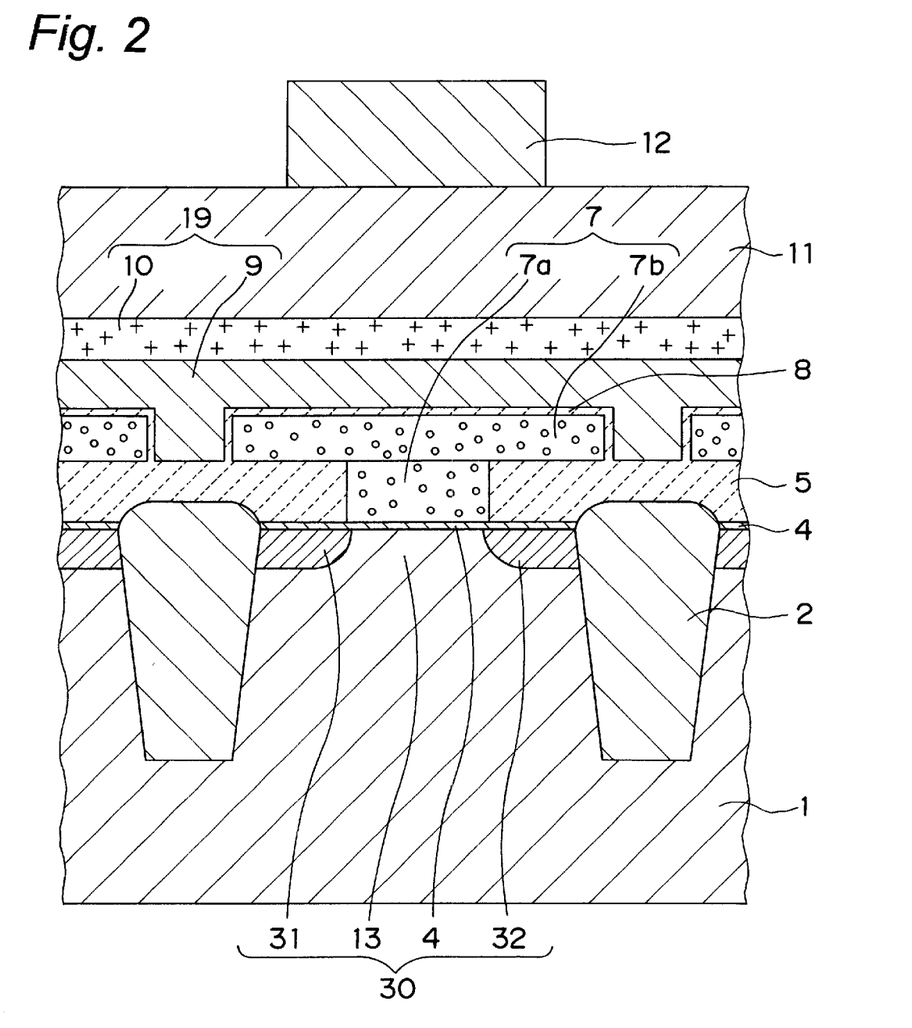
FIG. 2 is a sectional view taken along lines A–A' of FIG. 1.

In FIG. 2, the reference numeral 5 denotes a silicon oxide film. Each of the memory cells is made as described above.

Figure 1:
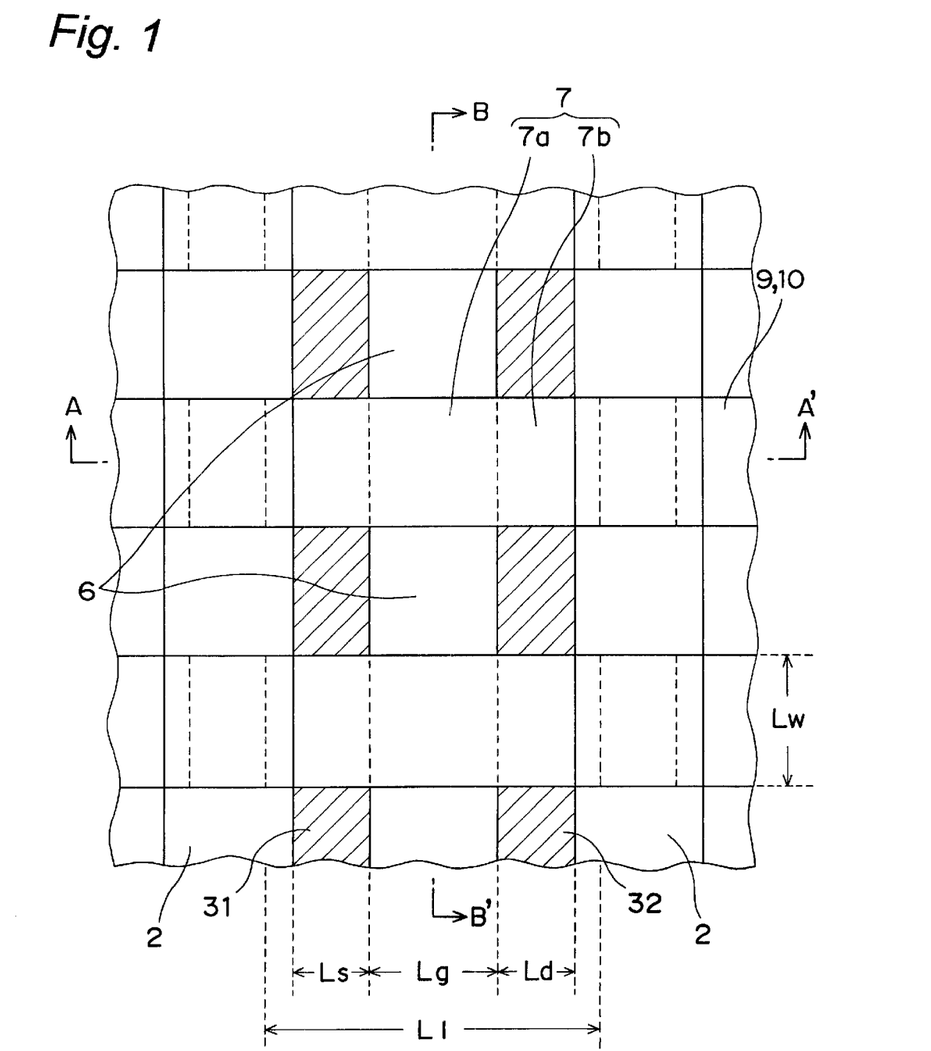
FIG. 1 is a plan view of the semiconductor memory according to the embodiment of the present invention.
Figure 3:
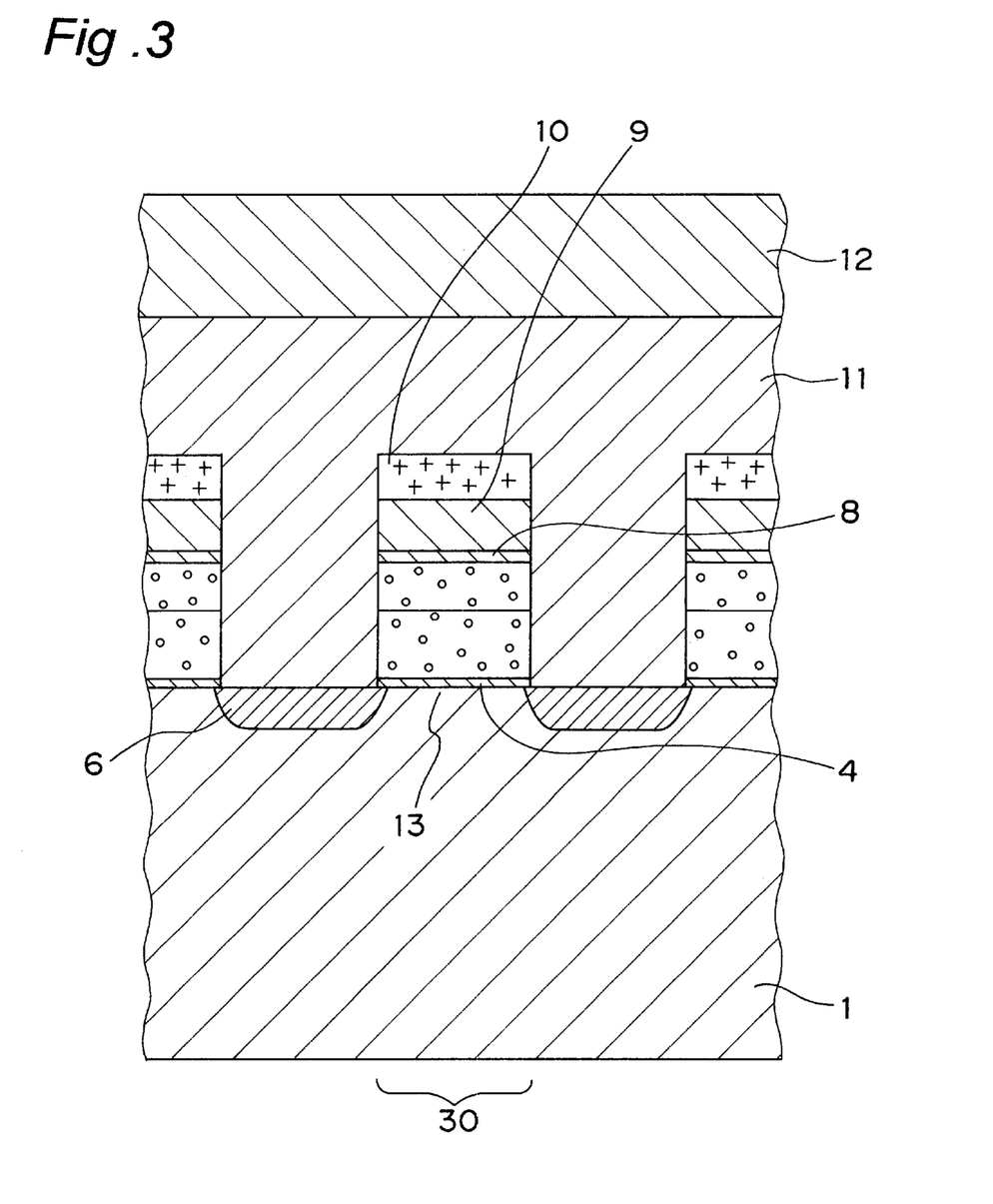
FIG. 3 is a sectional view taken along lines B–B' of FIG. 1.

The control gates 19 of the memory cells arranged in one direction (row) among the plurality of the memory cells according to this embodiment are formed integrally in a contiguous arrangement as shown in FIG. 1 and FIG. 2. Adjacent memory cells among the plurality of memory cells disposed in the direction of row are separated by an element separation region 2 made of, for example, silicon oxide film, as shown in FIG. 1 and FIG. 2. The channel regions 13 of the adjacent memory cells among the plurality of memory cells disposed in the direction of column perpendicular to the row are separated from each other by a p-type diffusion region 6 as shown in FIG. 1 and FIG. 3.

The floating gate 7 of each memory cell transistor, in this embodiment in particular, consists of (1) a first region 7a located over the channel region 13 via the tunnel oxide film (first oxide film) and (2) a second region 7b formed to be wider than the first region 7a in order to have a large area that opposes the control gate 19 for the purpose of increasing the electrostatic capacitance formed between itself and the control gate 19.

The semiconductor memory of this embodiment is characterized in that the floating gate 7 having T-shaped longitudinal section consisting of the first region 7a and the second region 7b increases the speed of writing data in the memory cell transistor by properly choosing the configuration thereof, as will be described below in detail.

<Detailed Procedure of Determining the Configuration of the T-shaped Floating Gate 7 According to the Invention>

In the memory cell of this embodiment, the channel region 13 takes an inverted state when voltage $V_{CG}$ applied to the control gate 19 and threshold voltage $V_{th}$ of the memory cell transistor satisfy the following relation of inequality (1).

$$V_{CG} > V_{th} \quad (1)$$

Figure 4:
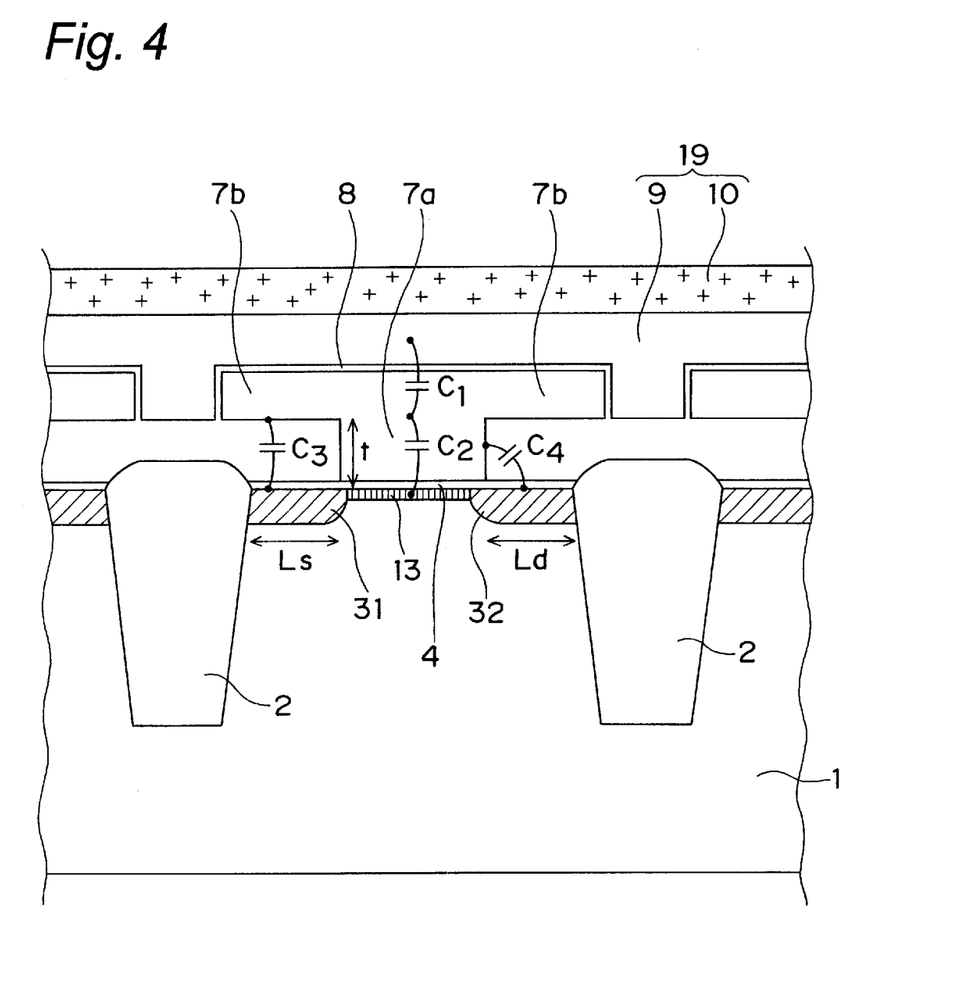
FIG. 4 is a sectional view (corresponding to FIG. 2) showing electrostatic capacitance formed around the floating gate in the semiconductor memory of the embodiment.
Figure 5:
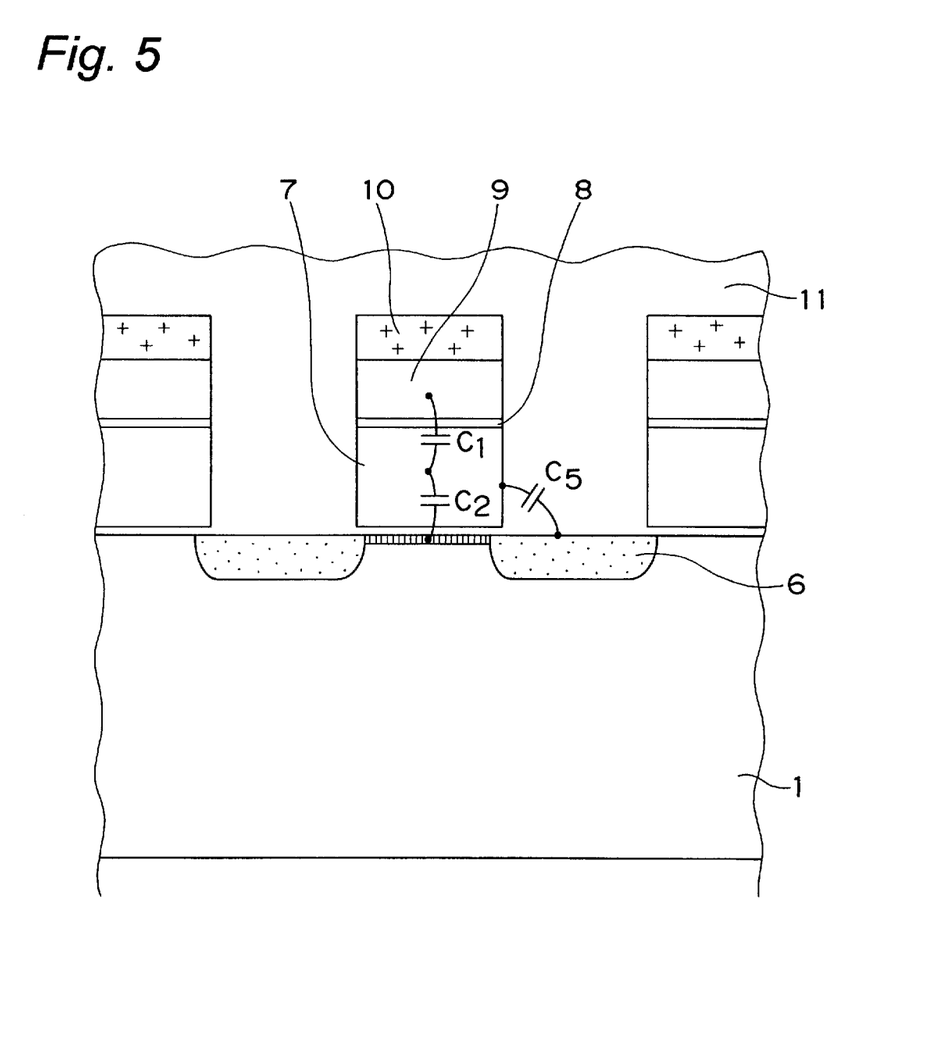
FIG. 5 is a sectional view (corresponding to FIG. 3) showing electrostatic capacitance formed around the floating gate in the semiconductor memory of the embodiment.

Electrostatic capacitance formed in the vicinity of the memory cell transistor of the semiconductor memory in this embodiment can be represented as shown in FIG. 4 and FIG. 5.

Figure 6:
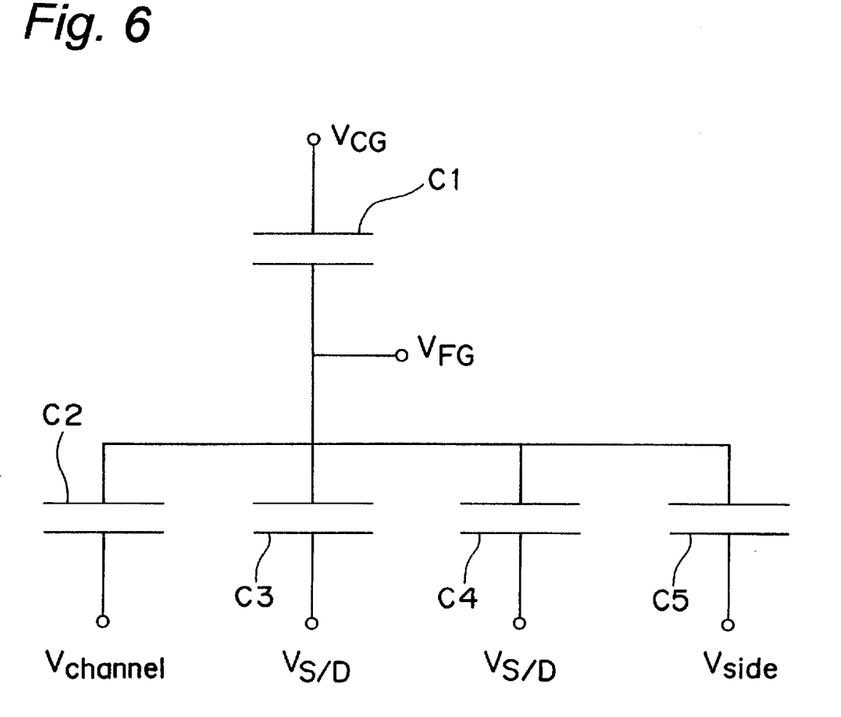
FIG. 6 is an equivalent circuit of the memory cell transistor in the semiconductor memory of the embodiment.

Consequently, the memory cell transistor at this time can be represented by the equivalent circuit shown in FIG. 6.

In the equivalent circuit shown in FIG. 6, $V_{CG}$ is the potential of the control gate 19, $V_{FG}$ is the potential of the floating gate 7, $V_{channel}$ is the potential of the channel region 13, $V_{S/D}$ is the voltage applied across the source region 31 and the drain region 32, and $V_{side}$ is the potential of the p-type diffusion layer 6.

Also as shown in FIG. 4 and FIG. 5,

C1 is the electrostatic capacitance between the control gate 19 and the second region 7b of the floating gate 7, C2 is the electrostatic capacitance between the first region 7a of the floating gate 7 and the channel region 13, C3 is the electrostatic capacitance between the second region 7b of the floating gate 7 and the source region 31 and between the second region 7b of the floating gate 7 and the drain region 32, C4 is the electrostatic capacitance between a side face of the first region 7a of the floating gate 7 and the source region 31 and the electrostatic capacitance between a side face of the first region 7a of the floating gate 7 and the drain region 32, and C5 is the electrostatic capacitance between the first region 7a of the floating gate 7 and the p-type diffusion layer 6

Thus in the semiconductor memory having the structure shown in FIG. 1 and FIG. 2, quantity of charge Q accumulated in the floating gate 7 of the memory cell transistor is given by equation (2).

$$Q = C1(V_{FG} - V_{CG}) + C2(V_{FG} - V_{channel}) + C3(V_{FG} - V_{S/D}) + C4(V_{FG} - V_{S/D}) + C5(V_{FG} - V_{side}) \quad (2)$$

Since it can be assumed that $V_{S/D}=0$, $V_{channe}=0$ and $V_{side}=0$ in the equation (2), the equation (2) can be simplified as equation (3) shown below.

$$Q = C1(V_{FG} - V_{CG}) + (C2 + C3 + C4 + C5)V_{FG} \quad (3)$$
$$= C_T V_{FG} - C1 V_{CG}$$

It will be understood that $C_T = C1+C2+C3+C4+C5$ which is the total electrostatic capacitance formed between the control gate and the Si substrate in each memory cell.

The floating gate potential $V_{FG}$ can be given by equation (4) shown below by modifying the equation (3).

$$V_{FG} = (Q + C1 V_{CG})/C_T \quad (4)$$

where $C1/C_T$ is called the coupling ratio.

In the semiconductor memory of this embodiment shown in FIG. 1, operation of writing in the memory cell transistor is carried out in the state of $V_{S/D}=V_{side}=V_{chaneel}=0$ by applying a predetermined value of control voltage $V_{CG}$.

When the control voltage $V_{CG}$ is applied in the state of $V_{S/D}=V_{side}=V_{chaneel}=0$, electrons are transported from the channel region to the floating gate 7, and the transported electrons are accumulated in the floating gate 7 thereby writing data therein.

Transportation of electrons to the floating gate 7 during the writing operation is governed by the following equation (5) of Fowler-Nordheim current.

$$j = A \cdot V_{FG}^2 \cdot \exp(-B/V_{FG}) \quad (5)$$

As will be apparent from equation the (5), current j increases and the writing speed increase as the floating gate potential $V_{FG}$ increases.

Therefore, it is preferable that the shape of the control gate 7 is determined so that the floating gate potential $V_{FG}$ shows the maximum value, more specifically the coupling ratio $C1/C_T$ becomes maximum when the control voltage $V_{CG}$ is applied, which makes it possible to increase the writing speed.

Now specific constitution that increases the floating gate potential $V_{FG}$ will be described in detail below.

When only the height t of the first region 7a is changed while maintaining the second region 7b of the floating gate 7 in the same configuration, C1 remains constant regardless of the value of t. When height t changes, however, distance between the second region 7b of the floating gate 7 and the source region 31 and distance between the second region 7b of the floating gate 7 and the drain region 32 change. Thus the electrostatic capacitance C3 is a function of height t. On the other hand, the electrostatic capacitance C4 between a side face of the first region 7a of the floating gate 7 and the source region 31 and the electrostatic capacitance C4 between a side face of the first region 7a of the floating gate 7 and the drain region 32 is a function of height t.

Since the electrostatic capacitance C5 between the first region 7a of the floating gate 7 and the p-type diffusion layer 6 also changes with the height t of the first region 7a similarly to C4, C5 is also a function of height t of the first region 7a. More specifically, as height t of the first region 7a increases, the electrostatic capacitance C3 decreases but the electrostatic capacitance C4 and C5 increase.

As described above, since the total electrostatic capacitance CT is a function of height t of the first region 7a, the floating gate potential $V_{FG}$ also becomes a function of height t of the first region 7a.

Figure 7:
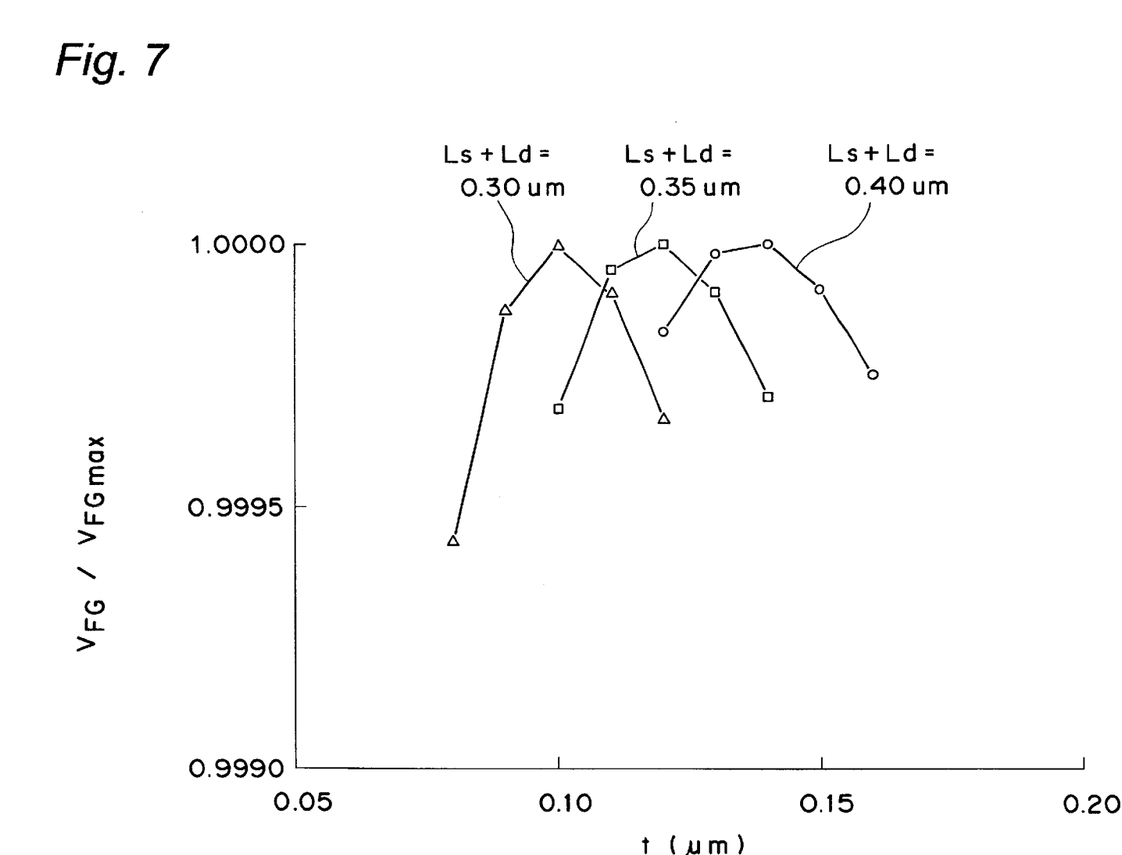
FIG. 7 is a graph showing the floating gate potential $V_{FG}$ versus the height t of the first region 7a when the value of (Ls+Ld) is set constant.

Therefore, the electrostatic capacitance C1 through C5 are represented in terms of the height t of the first region 7a and (Ls+Ld) according to the shape of the floating gate 7 and the constitution of the memory cell, and are substituted in the equation (4), thereby to give the floating gate potential $V_{FG}$ as a function of t and (Ls+Ld). Then as the value of t is changed while maintaining the value of (Ls+Ld) constant at 0.30 μm, 0.35 μm and 0.40 μm, the floating gate potential $V_{FG}$ takes a maximum value at a particular height t as shown in FIG. 7.

While the electrostatic capacitance C1 through C3 can be represented relatively easily in terms of the height t of the first region 7a and (Ls+Ld) by using the method of evaluating the electrostatic capacitance of a pair of parallel plates, the electrostatic capacitance C4 and C5 were calculated using a method described in "Practice in Electromagnetism" by Kennichi GOTO and Shuichiro YAMAZAKI (p52, 1$^{st}$ edition, Kyoritsu Publishing Co., Ltd.).

The floating gate potential $V_{FG}$ depends on the value of (Ls+Ld), as described above, but has a maximum value for a particular value of (Ls+Ld), and one value of the height t of the first region 7a is uniquely determined for the maximum value. Also because the writing speed increases as the floating gate potential $V_{FG}$ increases, the writing speed takes a maximum value when the height t of the first region 7a has a value that corresponds to the maximum value of the floating gate potential $V_{FG}$.

Figure 8:
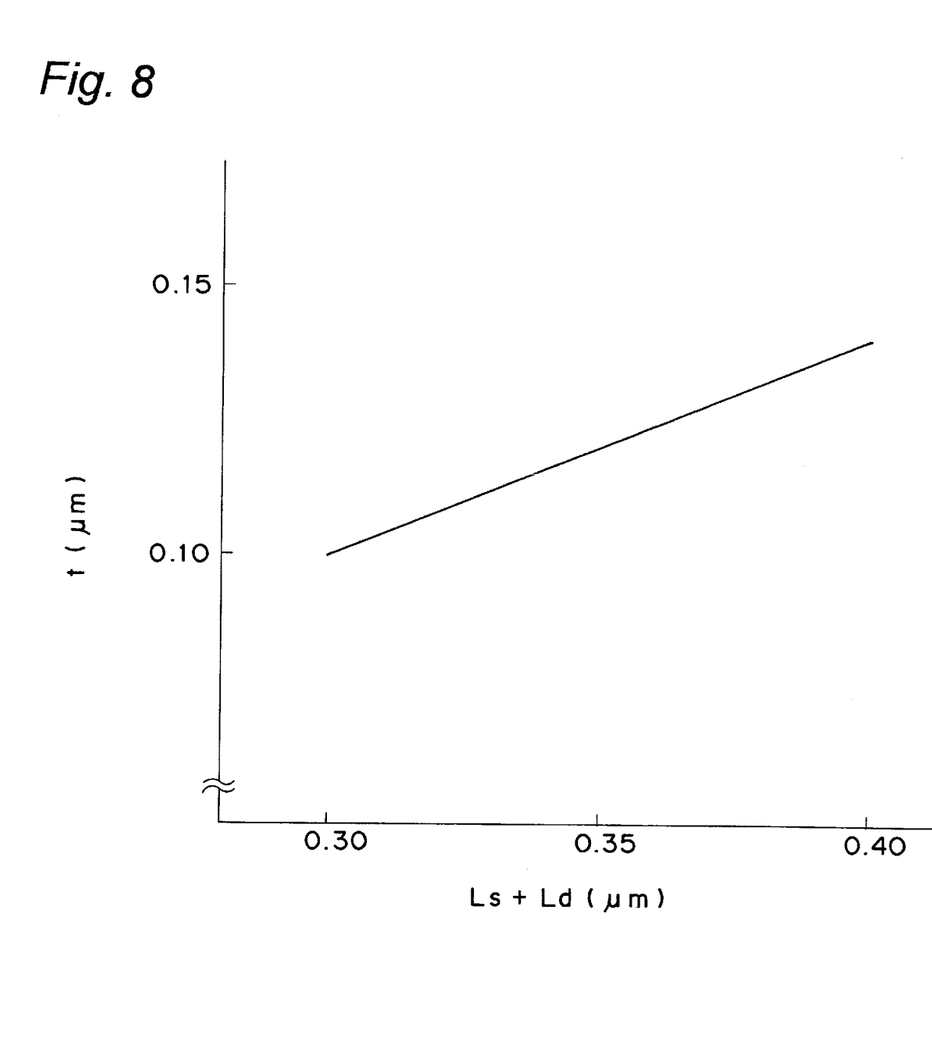
FIG. 8 is a graph showing the height t of the first region 7a versus (Ls+Ld) that maximizes the floating gate potential $V_{FG}$.

FIG. 8 shows the height t of the first region 7a where the floating gate potential $V_{FG}$ (or writing speed) takes the maximum value, versus (Ls+Ld).

As shown in FIG. 8, the height t of the first region 7a where the floating gate potential $V_{FG}$ (or writing speed) takes the maximum value increases as the value of (Ls+Ld) increases.

Data shown in FIG. 7 and FIG. 8 were calculated by using the values shown below for the memory cell structure shown in FIG. 1.
Dielectric constant of vacuum $\in_o$: 8.85×10$^{-14}$ F/cm
Relative dielectric constant of SiO$_2$ $\in_{ox}$: 3.85
Thickness of second region 7b of the floating gate 7: 0.07 μm
Length of floating gate Lg: 0.25 μm
Thickness of tunnel insulating film: 8.5 nm
Thickness of inter-polysilicon insulating film: 15 nm
Width of floating gate Lw: 0.20 μm
Lg+Ld: 0.40 μm, 0.35 μm, 0.30 μm
Length of longer side of second region 7b: 0.81 μm (when Lg+Ld is 0.40 μm), 0.76 μm (when Lg+Ld is 0.35 μm), 0.71 μm (when Lg+Ld is 0.30 μm)

The semiconductor memory of this embodiment is a flash memory having the floating gate that consists of the first region 7a located over the channel region and the second region formed to be wider than the first region 7a to have T-shaped longitudinal section, wherein height t of the first region 7a of the floating gate 7 is set as follows.

(1) Height t of the first region 7a and (Ls+Ld) are set so that the floating gate potential $V_{FG}$ becomes maximum when the predetermined control gate voltage is applied.

(2) In other words, height t of the first region 7a and (Ls+Ld) are set so that the coupling ratio C1/$C_T$ becomes maximum.

(3) Further in other words, height t of the first region 7a is set so that the electrostatic capacitance (C2+C3+C4+C5) becomes minimum when the electrostatic capacitance C1 is set to a particular value (when the second region 7b of the floating gate 7 is made in a particular shape).

In the semiconductor memory of the embodiment having such a constitution as described above, the floating gate potential $V_{FG}$ can be increased and the writing speed can be made higher.

In the embodiment described above, height t of the first region 7a and (Ls+Ld) are set so that the floating gate potential $V_{FG}$ becomes maximum or the coupling ratio C1/$C_T$ becomes maximum when the predetermined control gate voltage is applied.

However, the present invention is not limited to this constitution. When the value of (Ls+Ld) is predetermined, for example, height t of the first region 7a may also be set so that the floating gate potential $V_{FG}$ becomes maximum or the coupling ratio C1/$C_T$ becomes maximum according to the predetermined value of (Ls+Ld).

That is, there may be such a case where possible values of (Ls+Ld) are limited in a certain range by the size of the memory cell and the required characteristics of the memory cell transistor. In such a case, height t of the first region 7a may be set so that the floating gate potential $V_{FG}$ becomes maximum or the coupling ratio C1/$C_T$ becomes maximum.

Variation 1

Figure 9:
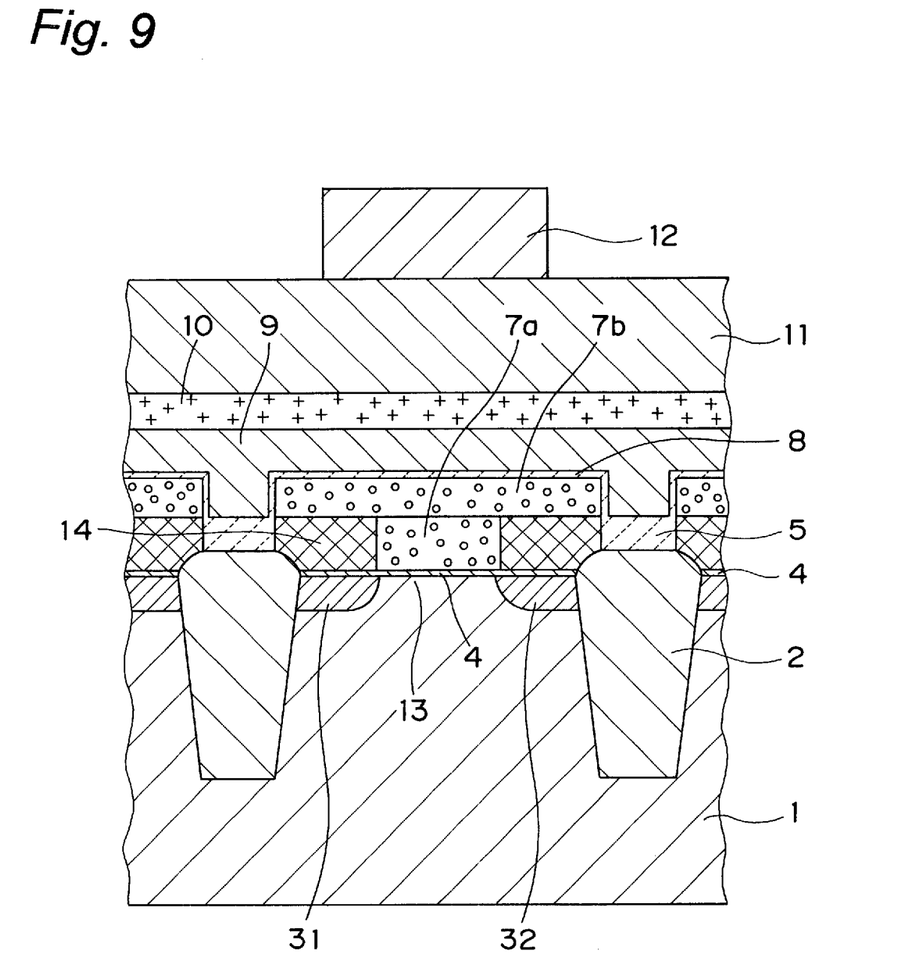
FIG. 9 is a sectional view of the semiconductor memory according to the first variation of the present invention.

FIG. 9 is a sectional view showing the constitution of the semiconductor memory according to the first variation of the present invention.

The semiconductor memory according to the first variation can be made similarly to the semiconductor memory of the embodiment except for a silicon nitride film 14 being formed between the second region 7b of the floating gate 7 and the source region 31 and between the second region 7b of the floating gate 7 and the drain region 32.

In the semiconductor memory of the first variation having such a constitution as described above, since the relative dielectric constant of the silicon nitride film 14 is about twice that of a silicon oxide film, the electrostatic capacitance C3 between the second region of the floating gate and the source region 31 and between the second region of the floating gate and the drain region 32, the electrostatic capacitance C4 between a side face of the first region 7a of the floating gate and the source region 31 and the electrostatic capacitance C4 between a side face of the first region 7a of the floating gate and the drain region 32 have higher values compared to the case of the embodiment, through height t of the first region 7a can be set so that the floating gate potential $V_{FG}$ becomes minimum, similarly to the embodiment.

Variation 2

Figure 10:
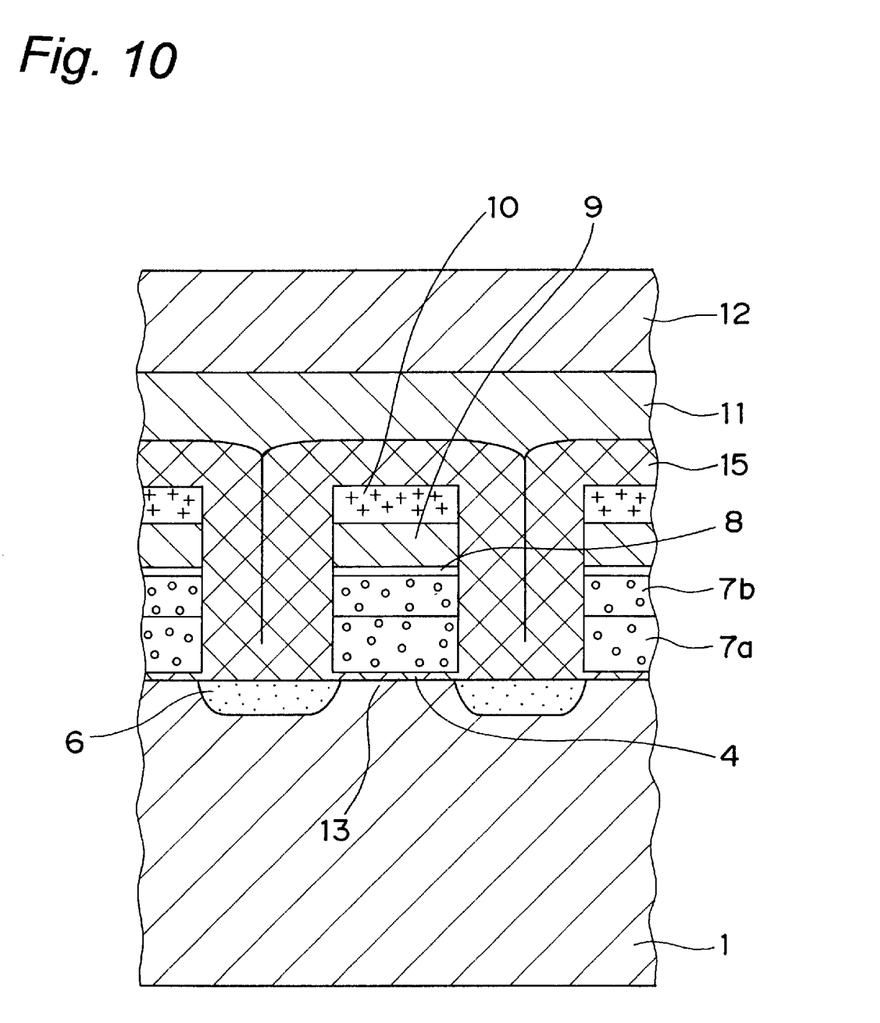
FIG. 10 is a sectional view of the semiconductor memory according to the second variation of the present invention.

FIG. 10 is a sectional view showing the constitution of the semiconductor memory according to the second variation of the present invention.

The semiconductor memory according to the second variation can be made similarly to the embodiment except for a silicon nitride film 15 being formed between adjacent memory cell transistors arranged in the direction of column.

In the semiconductor memory of the second variation having such a constitution as described above, since the relative dielectric constant of the silicon nitride film 15 is about twice that of a silicon oxide film, the electrostatic capacitance C5 between the first region 7a of the floating gate and the p-type diffusion layer 6 has a higher value compared to the case of the embodiment, through height t of the first region 7a can be set so that the floating gate potential $V_{FG}$ becomes minimum, similarly to the embodiment.

What is claimed is:

1. A semiconductor memory comprising a plurality of memory cells on a p-type Si substrate, each of said memory cells having a channel region, an n-type drain region and an n-type source region that are disposed on both sides of the channel region, a floating gate formed over said channel region via a first oxide film and a control gate formed over said floating gate via a second oxide film, wherein said floating gate includes a first region located over said channel region via said first oxide film and a second region that is wider than said first region and is capacitively coupled with said control gate via said second oxide film, said floating gate having T-shaped longitudinal section, and wherein said first region has a height such that said floating gate has the maximum potential when a control voltage is applied to said control gate.

2. A semiconductor memory comprising: a plurality of memory cells on a p-type Si substrate, each of said memory cells having a channel region, an n-type drain region and an n-type source region that are disposed on both sides of said channel region, a floating gate formed over said channel region via a first oxide film and a control gate formed over said floating gate via a second oxide film, wherein said floating gate includes a first region located over said channel region via said first oxide film and a second region that is wider than said first region and is capacitively coupled with said control gate via said second oxide film, said floating gate having T-shaped longitudinal section, wherein said first region has a height such that maximum coupling ratio is obtained, the maximum coupling ratio being the ratio of the electrostatic capacitance between said control gate and said floating gate to the electrostatic capacitance of the entire memory cell formed between said control gate and said Si substrate in each memory cell.

3. The semiconductor memory according to claim 1, wherein:

the first region of the floating gate has side surfaces;

the second region of the floating gate has an upper surface and side surfaces;

the second oxide film is on the upper surface and side surfaces of the second region of the floating gate; and an insulating layer adjoins side surfaces of the first region of the gate electrode.

4. The semiconductor memory according to claim 3, wherein the control gate extends along the side surfaces of the first region of the floating gate with the second oxide film therebetween.

5. The semiconductor memory according to claim 3, wherein the insulating layer adjoining the side surfaces of the first region of the floating gate comprises silicon nitride.

6. The semiconductor memory according to claim 2 wherein:

the first region of the floating gate has side surfaces;

the second region of the floating gate has an upper surface and side surfaces;

the second oxide film is formed on the upper surface and side surfaces of the second region of the floating gate; and an insulating layer adjoins the side surfaces of the first region of the floating gate.

7. The semiconductor memory according to claim 6, wherein the control gate extends along the side surfaces of the first region of the floating gate with the second oxide film therebetween.

8. The semiconductor memory according to claim 6, wherein the insulating layer adjoining the side surfaces of the first region of the floating gate comprises silicon nitride.

* * * * *